United States Patent
Koizumi

(10) Patent No.: US 12,271,813 B2
(45) Date of Patent: Apr. 8, 2025

(54) METHOD FOR DETERMINING OPTIMAL NUMBER OF SUBMODULES FOR USE IN SEMICONDUCTOR MANUFACTURING APPARATUS INCLUDING SUBSTRATE PROCESSING MODULE INCLUDING PLURALITY OF SUBMODULES, AND SEMICONDUCTOR MANUFACTURING APPARATUS

(71) Applicant: EBARA CORPORATION, Tokyo (JP)

(72) Inventor: Ryuya Koizumi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 673 days.

(21) Appl. No.: 17/552,835

(22) Filed: Dec. 16, 2021

(65) Prior Publication Data
US 2022/0222524 A1     Jul. 14, 2022

(30) Foreign Application Priority Data
Jan. 12, 2021 (JP) .................... 2021-002657

(51) Int. Cl.
| | |
|---|---|
| G06N 3/08 | (2023.01) |
| G06F 30/27 | (2020.01) |
| G06F 30/392 | (2020.01) |
| G06F 30/398 | (2020.01) |
| G06N 20/00 | (2019.01) |

(52) U.S. Cl.
CPC .............. *G06N 3/08* (2013.01); *G06F 30/27* (2020.01); *G06F 30/392* (2020.01); *G06F 30/398* (2020.01); *G06N 20/00* (2019.01)

(58) Field of Classification Search
CPC ............ G06N 3/08; G06N 20/00; G06N 7/01; G06N 3/006; G06F 30/27; G06F 30/392; G06F 30/398; H01L 21/67028; H01L 21/67173; H01L 21/6723; H01L 21/67276
USPC ........................................................ 716/132
See application file for complete search history.

(56) References Cited

U.S. PATENT DOCUMENTS

2018/0294174 A1* 10/2018 Fujikata ............... G05B 19/058

FOREIGN PATENT DOCUMENTS

JP          2014-135381 A      7/2014

* cited by examiner

*Primary Examiner* — Paul Dinh
(74) *Attorney, Agent, or Firm* — BakerHostetler

(57) ABSTRACT

An optimal number of modules for use is accurately estimated in a semiconductor manufacturing apparatus. Provided is a method applied to a semiconductor manufacturing apparatus including one or a plurality of substrate processing modules each including a plurality of submodules. The present method includes a step of estimating the optimal number of the submodules for use, based on a target production amount and predicted production amount of substrates and a use rate of the substrate processing module, a step of preparing, based on the estimated optimal number for use, a schedule to process a substrate with the optimal number of the submodules for use, a step of updating, based on the prepared schedule, the predicted production amount and the use rate, and a step of repeating the estimating step by use of the updated predicted production amount and use rate, to update the optimal number of the submodules for use.

12 Claims, 7 Drawing Sheets

METHOD FOR DETERMINING OPTIMAL NUMBER OF SUBMODULES FOR USE IN SEMICONDUCTOR MANUFACTURING APPARATUS INCLUDING SUBSTRATE PROCESSING MODULE INCLUDING PLURALITY OF SUBMODULES, AND SEMICONDUCTOR MANUFACTURING APPARATUS

TECHNICAL FIELD

The present invention relates to a method for determining, in a semiconductor manufacturing apparatus including a substrate processing module including a plurality of submodules, an optimal number of the submodules for use, and a semiconductor manufacturing apparatus.

BACKGROUND ART

In a semiconductor manufacturing apparatus, a production amount of substrates changes depending on situations every moment. In an off-season in which a demand production amount is small, if the number of modules for use is decreased and an unused module is set to an idle state, power consumption can be reduced. Conversely, in an on-season in which the production amount is large, it is necessary to increase the modules for use. It is also known that each module is set to a power saving mode, based on a calculated transfer schedule, in a case where substrate processing is not performed over a predetermined. time or more (e.g., see PTL 1).

CITATION LIST

Patent Literature

PTL 1: Japanese Patent Laid-Open No. 2014-135381

SUMMARY OF INVENTION

Technical Problem

In the current situation, however, the number of modules required to be used depending on a demand production amount in each season is not known, and the number of the modules for use is not adjusted. If all modules are eventually placed on standby for use, a large amount of standby power is always consumed.

An unused module can be set to an idle state in accordance with a prepared substrate transfer schedule. However, if the substrate transfer schedule is prepared on the assumption that all the modules are set for use, an actual production amount may be excessively large for the demand production amount.

Also, if there is only one type of recipe of substrate processing and the same type of substrates are always produced in mass, the number of the modules required depending on the production amount can be comparatively easily calculated. However, in a situation where the substrates are produced with various recipes in a mixed manner, the actual production amount cannot be predicted for the number of the modules for use.

One of objects of the present invention, which has been made in view of the above respects, is to accurately estimate an optimal number of modules for use in a semiconductor manufacturing apparatus.

Solution to Problem

[Aspect 1]

According to Aspect 1, provided is a method for determining, in a semiconductor manufacturing apparatus comprising one or a plurality of substrate processing modules each including a plurality of submodules, an optimal number of the submodules for use, the method comprising a step of estimating the optimal number of the submodules for use, based on a target production amount and predicted production amount of substrates and a use rate of the substrate processing module, a step of preparing, based on the estimated optimal number for use, a schedule to process a substrate with the optimal number of the submodules for use, a step of updating, based on the prepared schedule, the predicted production amount and the use rate, and a step of repeating the estimating step by use of the updated predicted production amount and use rate, to update the optimal number of the submodules for use.

[Aspect 2]

According to Aspect 2, in the method of Aspect 1, the estimating step includes estimating the optimal number of the submodules for use by use of reinforcement learning in which the target production amount and predicted production amount of the substrates and the use rate of the substrate processing module are represented by a state $s_t$, the number of the submodules to be operated for processing the substrate is represented by an action $a_t$, and an action value of each action $a_t$ in each state $s_t$ is represented by $Q(s_t, a_t)$.

[Aspect 3]

According to Aspect 3, in the method of Aspect 2, the target production amount and predicted production amount of the substrates are a target production amount and predicted production amount for each type of substrate to be produced.

[Aspect 4]

According to Aspect 4, in the method of Aspect 2, an immediate reward $r_t$ of the reinforcement learning is set based on a difference between the target production amount and the predicted production amount.

[Aspect 5]

According to Aspect 5, in the method of Aspect 3, an immediate reward $r_t$ of the reinforcement learning is set based on a difference between the target production amount and the predicted production amount for each type of the substrate.

[Aspect 6]

According to Aspect 6, in the method of any one of Aspects 2 to 5, an immediate reward $r_t$ of the reinforcement learning is set based on a product of use rates of the respective substrate processing modules.

[Aspect 7]

According to Aspect 7, in the method of any one of Aspects 2 to 6, the plurality of substrate processing modules are a plurality of substrate processing modules performing different types of processing on the substrate, and the use rate of the substrate processing module is a use rate of each of the substrate processing modules that are different from one another in processing type.

[Aspect 8]

According to Aspect 8, in the method of Aspect 7, the action value $Q(s_t, a_t)$ is an action value corresponding to the number of submodules to be operated for each of the substrate processing modules that are different from one another in processing type.

[Aspect 9]

According to Aspect 9, in the method of any one of Aspects 2 to 8, the reinforcement learning is deep reinforcement learning.

[Aspect 10]

According to Aspect 10, the method of any one of Aspects 1 to 9 further comprises a step of setting use or non-use of each submodule, based on the optimal number for use.

[Aspect 11]

According to Aspect 11, in the method of Aspect 10, the setting step includes setting such that a plurality of submodules for use are included in the same substrate processing module.

[Aspect 12]

According to Aspect 12, in the method of any one of Aspects 1 to 11, the substrate processing module is a plating module including a plurality of plating devices, and the submodules are the plating devices.

[Aspect 13]

According to Aspect 13, provided is a semiconductor manufacturing apparatus comprising one or a plurality of substrate processing modules each including a plurality of submodules, the semiconductor manufacturing apparatus being configured to estimate an optimal number of the submodules for use, based on a target production amount and predicted production amount of substrates, and a use rate of the substrate processing module, prepare, based on the estimated optimal number for use, a schedule to process the substrate with the optimal number of the submodules for use, update, based on the prepared schedule, the predicted production amount and the use rate, and repeat the estimating step by use of the updated predicted production amount and use rate, to update the optimal number of the submodules for use.

DESCRIPTION OF EMBODIMENT

Figure 1:
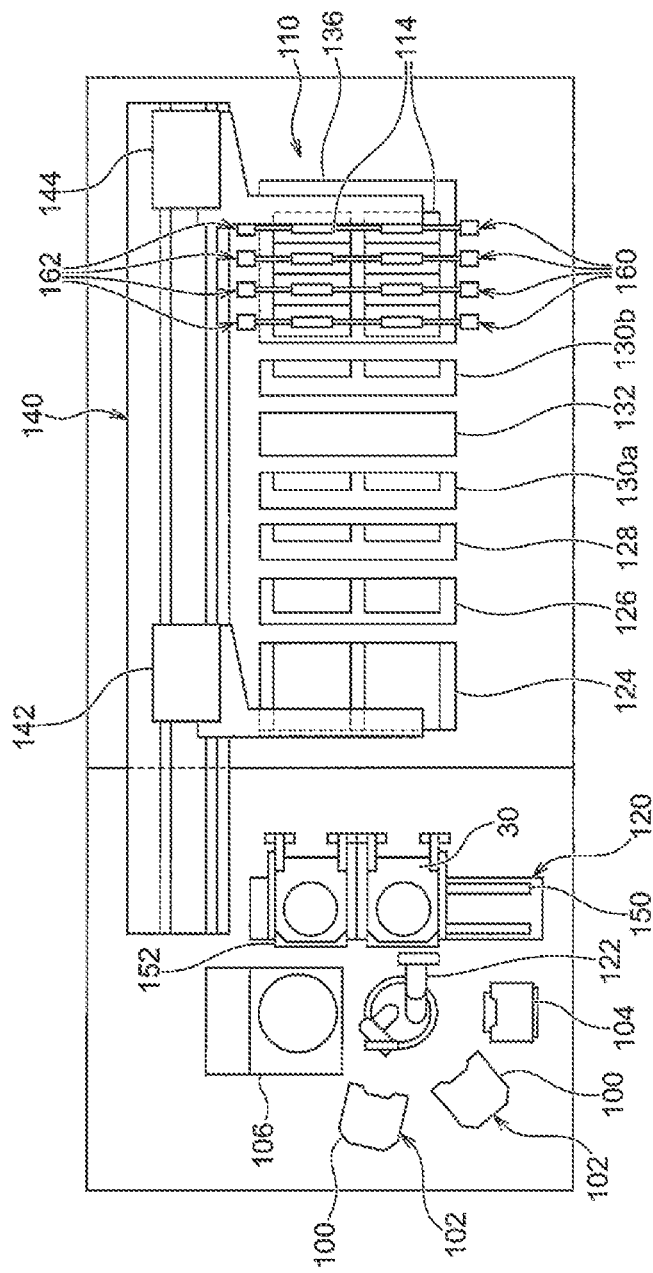
FIG. 1 is an overall layout of a plating apparatus to which a method according to an embodiment of the present invention can be applied.

Hereinafter, description will be made as to an embodiment of the present invention with reference to the drawings. In the drawings described below, the same or corresponding constituent elements are denoted with the same reference sign and redundant description is not repeated.

FIG. 1 is an overall layout of a plating apparatus 10 to which a method according to an embodiment of the present invention can be applied. The plating apparatus 10 is an example of a semiconductor manufacturing apparatus. Hereinafter, the embodiment of the present invention will be described with reference to the plating apparatus 10, and the method according to the embodiment of the present invention can be applied also to a semiconductor manufacturing apparatus other than the plating apparatus.

As shown in FIG. 1, the plating apparatus 10 includes two cassette tables 102, an aligner 104 that aligns a position of an orientation flat, a notch or the like of a substrate in a predetermined direction, and a spin rinse dryer 106 that dries the plated substrate by rotating the substrate at high speed. On each cassette table 102, a cassette 100 containing the substrate such as a semiconductor wafer is mounted. Near the spin rinse dryer 106, a load/unload station 120 including a substrate holder 30 mounted thereon is disposed to attach and remove the substrate. In a center of these devices 100, 104, 106 and 120, a transfer robot 122 is disposed to transfer the substrate to and from these devices.

The load/unload station 120 includes a flat plate-shaped mounting plate 152 that is slidable in a lateral direction along a rail 150. Two substrate holders 30 are horizontally mounted in parallel on the mounting plate 152. The substrate is delivered between one of the substrate holders 30 and the transfer robot 122, the mounting plate 152 is then laterally slid, and the substrate is delivered between the other substrate holder 30 and the transfer robot 122.

The plating apparatus 10 further includes a stocker 124, a pre-wet module 126, a pre-soak module 128, a first rinse module 130a, a blow module 132, a second rinse module 130b, and a plating module 110. In the stocker 124, the substrate holder 30 is stocked and temporarily stored. In the pre-wet module 126, the substrate is immersed into pure water. In the pre-soak module 128, an oxide film on the surface of a conductive layer such as a seed layer formed on the surface of the substrate is removed by etching. In the first rinse module 130a, the pre-soaked substrate is cleaned together with the substrate holder 30 with a cleaning solution (pure water or the like). In the blow module 132, the cleaned substrate is drained. In the second rinse module 130b, the plated substrate is cleaned together with the substrate holder 30 with the cleaning solution. The load/unload station 120, the stocker 124, the pre-wet module 126, the pre-soak module 128, the first rinse module 130a, the blow module 132, the second rinse module 130b and the plating module 110 are arranged in this order.

The plating module 110 is configured, for example, by housing a plurality of plating devices 114 in an overflow tank 136. In an example of FIG. 1, the plating module 110 includes eight plating devices 114. Each plating device 114 stores one substrate therein, and is configured to immerse the substrate into a plating solution held therein and plate the surface of the substrate with copper or the like. The plating module 110 is an example of "a substrate processing module", and the plating device 114 is an example of "a submodule". The plating module 110 (the substrate processing module) includes a plurality of plating devices 114 (submodules.

The plating apparatus 10 includes a transfer device 140 in which, for example, a linear motor system is adopted, the transfer device being located on a side of each of the devices, to transfer the substrate holder 30 together with the substrate to and from these respective devices. The transfer device 140 includes a first transfer device 142 and a second transfer device 144. The first transfer device 142 is configured to transfer the substrate to and from the load/unload station 120, the stocker 124, the pre-wet module 126, the pre-soak module 128, the first rinse module 130a, and the blow module 132. The second transfer device 144 is configured to transfer the substrate to and from the first rinse module 130a, the second rinse module 130b, the blow module 132, and the plating module 110. The plating apparatus 10 does not have to include the second transfer device 144, and may only include the first transfer device 142.

On opposite sides of the overflow tank 136, paddle drive parts 160 and paddle driven parts 162 are arranged to drive paddles that are stirring rods located in the respective plating devices 114, to stir the plating solution in the plating devices 114.

An example of a procedure of plating processing by the plating apparatus 10 will be described. First, one substrate is taken out from the cassette 100 mounted on each cassette table 102 with the transfer robot 122, to transfer the substrate to the aligner 104. The aligner 104 aligns the position of the orientation flat, the notch or the like in the predetermined direction. The substrate oriented with the aligner 104 is transferred to the load/unload station 120 by the transfer robot 122.

In the load/unload station 120, two substrate holders 30 stored in the stocker 124 are simultaneously grasped with the first transfer device 142 of the transfer device 140, and are transferred to the load/unload station 120. Then, the two substrate holders 30 are simultaneously horizontally mounted on the mounting plate 152 of the load/unload station 120. In this state, the substrate is transferred to each substrate holder 30 by the transfer robot 122, and the transferred substrate is held by the substrate holder 30.

Next, the two substrate holders 30 holding the substrates are simultaneously grasped with the first transfer device 142 of the transfer device 140, and are stored in the pre-wet module 126. Next, each substrate holder 30 holding the substrate processed in the pre-wet module 126 is transferred to the pre-soak module 128 with the first transfer device 142, and the oxide film on the substrate is etched with the pre-soak module 128. Subsequently, the substrate holder 30 holding the substrate is transferred to the first rinse module 130a, to wash the surface of the substrate with pure water stored in the first rinse module 130a.

The substrate holder 30 holding the substrate washed with water is transferred from the first rinse module 130a to the plating module 110 with the second transfer device 144, and is stored in each plating device 114 filled with the plating solution. The second transfer device 144 sequentially repeats the above procedure, to sequentially store the substrate holders 30 holding the substrates in the respective plating devices 114 of the plating module 110.

In each plating device 114, a plating voltage is applied between an anode (not shown) and the substrate in the plating device 114, and the paddle is reciprocally moved in parallel with the surface of the substrate simultaneously by each paddle drive part 160 and each paddle driven part 162, to plate the surface of the substrate.

After the plating ends, two substrate holders 30 holding the plated substrates are simultaneously grasped with the second transfer device 144, transferred to the second rinse module 130b, and immersed into pure water stored in the second rinse module 130h to clean the surfaces of the substrates with pure water. Next, the substrate holders 30 are transferred to the blow module 132 by the second transfer device 144, and water drops adhered to the substrate holders 30 are removed by blowing air or the like. Afterward, the substrate holders 30 are transferred to the load/unload station 120 by the first transfer device 142.

In the load/unload station 120, the transfer robot 122 takes out each processed substrate from the substrate holder 30, and transfers the substrate to the spin rinse dryer 106. The spin rinse dryer 106 rotates at high speed to rotate the plated substrate at high speed and dry the substrate. The transfer robot 122 returns the dried substrate to the cassette 100.

Figure 2:
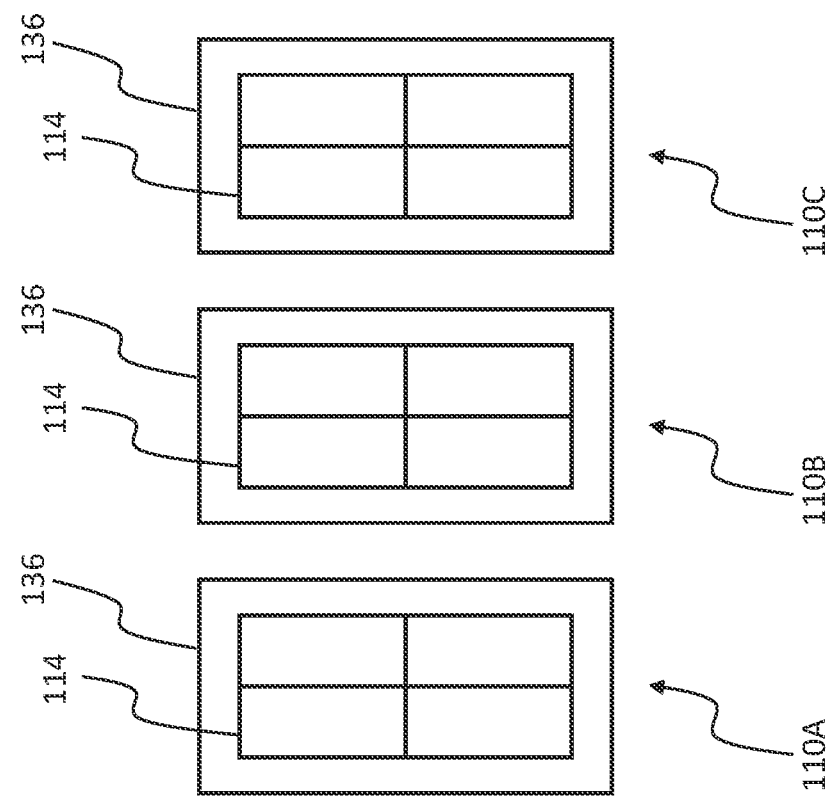
FIG. 2 shows another configuration example of a plating module in the plating apparatus.

FIG. 2 shows another configuration example of the plating module 110 in the plating apparatus 10. In FIG. 2, the plating, apparatus 10 includes a first plating module 110A, a second plating module 110B, and a third plating module 110C. Each of the first plating module 110A, the second plating module 110B and the third plating module 110C has a configuration similar to that of the plating module 110 in the plating apparatus 10 of FIG. 1. Specifically, each of the plating modules 110A, 110B and 110C includes the overflow tank 136 and a plurality of plating devices 114. In the example of FIG. 2, each of the plating modules 110A, 110B and 110C (substrate processing modules) includes four plating devices 114 (submodules). Each of the plating modules 110A, 110B and 110C and the second rinse module 130b (not shown in FIG. 2) may be installed side by side. The first plating module 110A, the second plating module 110B and the third plating module 110C may perform the same type of plating (e.g., copper plating) processing, or may perform different types of plating (e.g., three types: copper plating, nickel plating, and solder (SnAg or the like) plating) processing. Also, the number of the plating modules included in the plating apparatus 10 and the number of the plating devices 114 included in one plating module are not limited to those of the example of FIG. 2, and may be any numbers.

Figure 3:
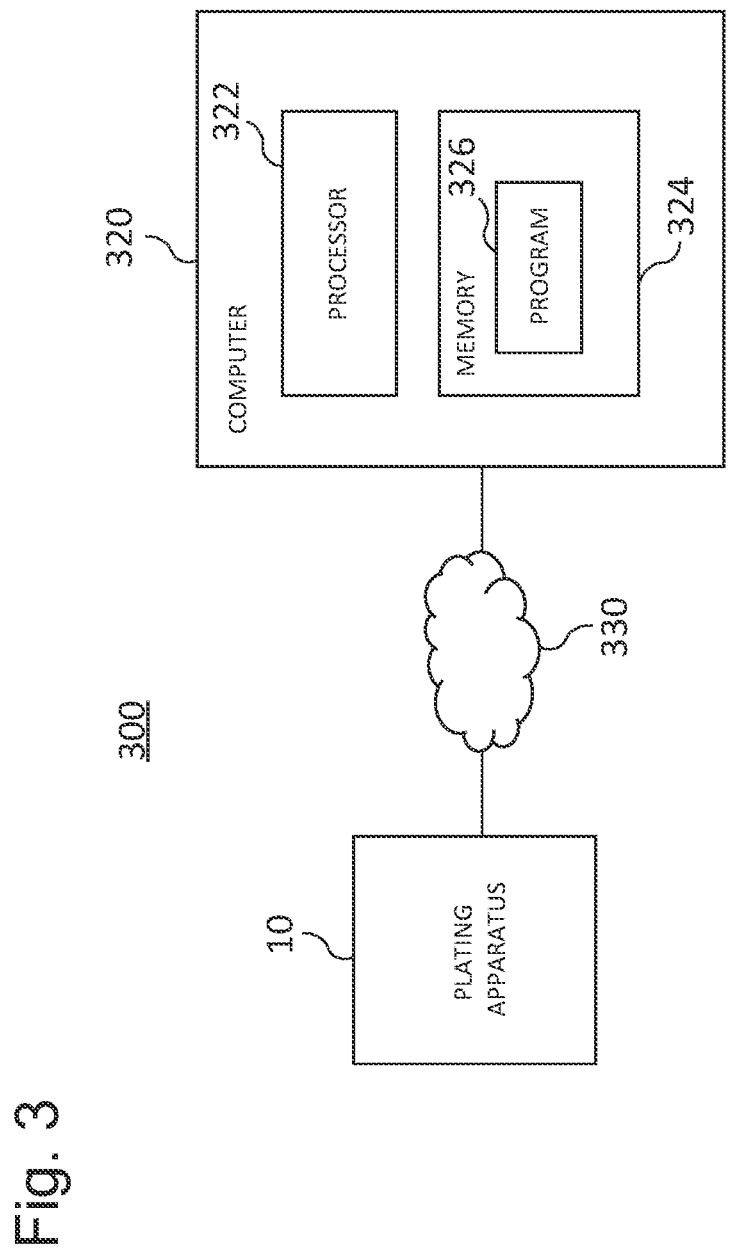
FIG. 3 is a configuration diagram of a system that performs the method according to the embodiment of the present invention.

FIG. 3 is a configuration diagram of a system 300 that performs the method according to the embodiment of the present invention. The system 300 includes the plating apparatus 10 and a computer 320. The plating apparatus 10 is a plating apparatus described with reference to FIG. 1 or 2. The plating apparatus 10 and the computer 320 are communicably connected to each other via a network 330 such as a local area network (LAN) or the Internet. Alternatively, the computer 320 may be incorporated, as a part of the configuration of the plating apparatus 10, into the plating apparatus 10. The computer 320 includes a processor 322 and a memory 324. The memory 324 stores a program 326 for achieving the method according to the embodiment of the present invention. The processor 322 reads out the program 326 from the memory 324 to execute the program. Consequently, the system 300 can perform the method according to the embodiment of the present invention. Note that FIG. 3 shows only one computer 320, but the system 300 may include a plurality of computers 320. In this configuration, the memory 324 of each computer 320 may store the program corresponding to a part of the method according to the embodiment of the present invention, and the processor 322 of each computer 320 may individually execute the program. Consequently, the plurality of computers 320 may cooperate to perform the method according to the embodiment of the present invention as a whole.

Figure 4:
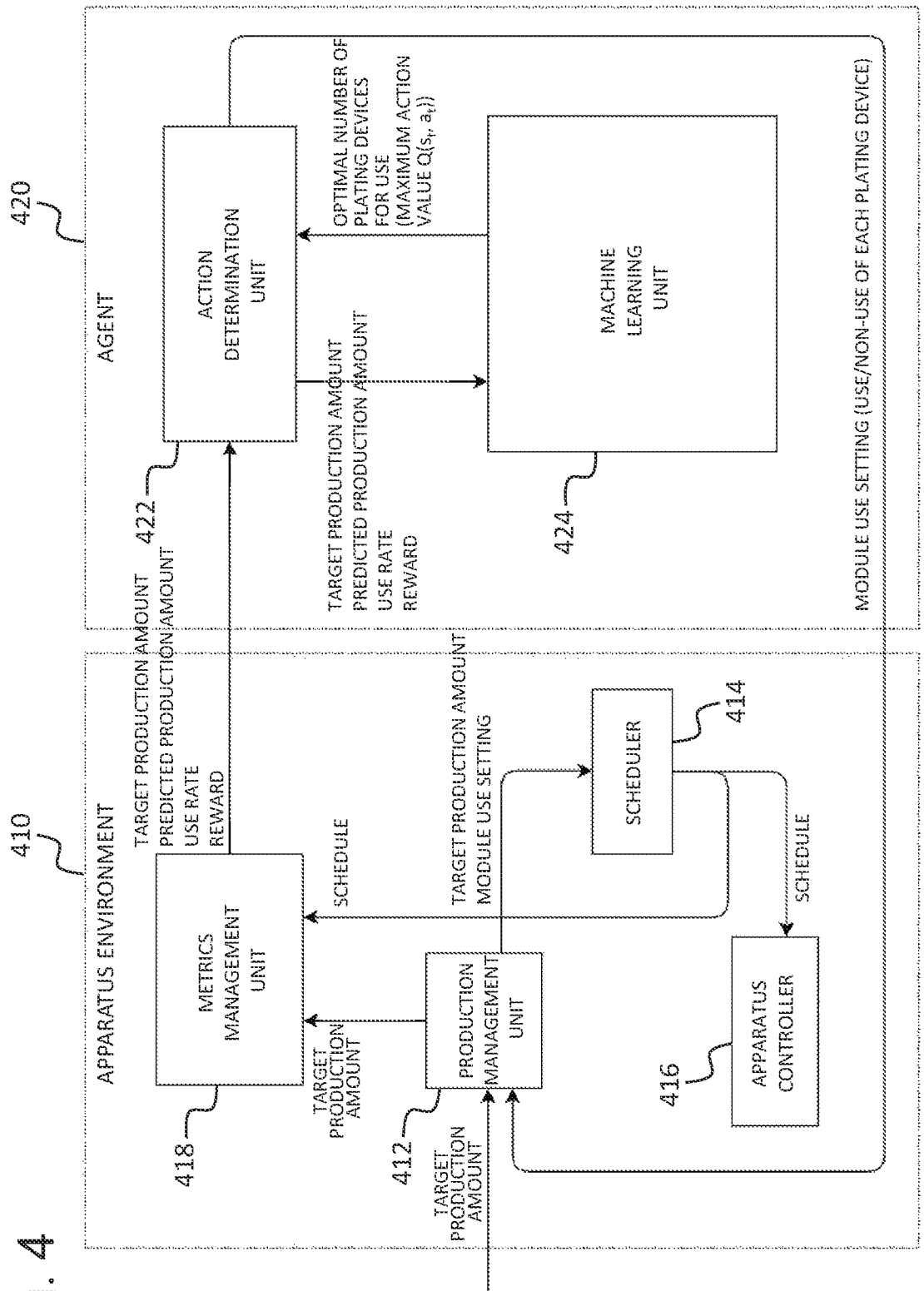
FIG. 4 is a block diagram representing functions of a computer in the system that performs the method according to the embodiment of the present invention.

FIG. 4 is a block diagram representing functions of the computer 320 in the system 300 that performs the method according to the embodiment of the present invention. As shown in FIG. 4, the functions of the computer 320 are divided into an apparatus environment 410 and an agent 420. The apparatus environment 410 includes a production management unit 412, a scheduler 414, an apparatus controller 416, and a metrics management unit 418. The agent 420 includes an action determination unit 422 and a machine learning unit 424. As described above, these functions may be achieved on one computer 320, or the respective functions (or some of all the functions) may be achieved by separate computers 320.

The production management unit 412 manages information associated with production of the substrates in the plating apparatus 10. In particular, the production management unit 412 manages information associated with a plating process in the plating module 110 (or the plating modules 110A, 110B and 110C, and hereinafter referred to simply as the plating module 110). The information includes, for example, a target number of substrates to be produced per unit time by the plating apparatus 10 (hereinafter, referred to as a target production amount), and setting concerning use/non-use of each of the plurality of plating devices 114 included in the plating module 110 (hereinafter, referred to as a module use setting).

The target production amount of the substrates may be calculated, for example, as an average production amount in a predetermined period that is most recent from the past production history of the plating apparatus 10, or may be provided from an operator of the plating apparatus 10 via a user interface. The module use setting is information that designates whether to use or halt the plating device 114 in substrate plating processing for each of the plurality of plating devices 114, and this setting is determined by the action determination unit 422, and the production management unit 412 is notified of the setting.

The scheduler 414 prepares operation schedules of respective modules (126, 128, 130a, 130b, 132, and 110) of the plating apparatus 10, the transfer device 140 and the respective other units (122, 120, 106 and others). In particular, the scheduler 414 prepares a schedule to plate the substrate in each plating device 114 of the plating module 110. The scheduler 414 can be notified of the target production amount and the module use setting from the production management unit 412, and can prepare the schedule based on the information.

The apparatus controller 416 controls operations of the respective modules (126, 128, 130a, 130b, 132, and 110) of the plating apparatus 10, the transfer device 140 and the respective other units (122, 120, 106 and others) in accordance with the schedule prepared by the scheduler 414.

The metrics management unit 418 prepares and manages information to be provided to the agent 420. The information to be provided to the agent 420 includes, for example, the target production amount of the substrates, a predicted production amount of the substrates, a use rate of the plating module 110, and a reward (described later) to be used by the machine learning unit 424 of the agent 420 when learning an optimal number of the plating devices 114 in the plating module 110 for use.

The target production amount of the substrates is notified from the production management unit 412. The predicted production amount of the substrates can be calculated (predicted), based on the schedule notified from the scheduler 414, as the number of the substrates expected to be produced per unit time in a case where the respective units (the plating module 110 and others) of the plating apparatus 10 operate in accordance with the schedule. Note that in a case where the number of the plating devices 114 to be actually used in the substrate plating processing in the plurality of plating devices 114 included in the plating module 110 is not optimal (e.g., the number of the plating devices 114 to be actually used is excessively large or small relative to the target production amount of the substrates), this predicted production amount of the substrates does not meet the target production amount of the substrates. The substrate target production amount and predicted production amount may be information for each type of substrate to be produced (e.g., the target production amount and predicted production amount of substrate type 1, the target production amount and predicted production amount of substrate type 2, and the target production amount and predicted production amount of substrate type 3). Here, "the type" of substrate may be a classification based on a type of plating to be applied to the substrate, or a classification based on a thickness of the same type of plating to be applied to the substrate.

In addition, the predicted production amount of the substrates is equal to an actual production amount of the plating apparatus 10 (the number of the substrates to be actually produced per unit time by the plating apparatus 10), as long as the respective units of the plating apparatus 10 operate in accordance with the schedule prepared by the scheduler 414), but the predicted production amount differs from the actual production amount in a case where the plating apparatus 10 does not operate on schedule (e.g., when a certain apparatus trouble occurs). If the predicted production amount is noticeably different from the actual production amount, validity of learning in the machine learning unit 424 drops. Consequently, it is always monitored whether an error between the substrate predicted production amount and actual production amount is within a predetermined range of a reference value. If the error is not within the range, the learning in the machine learning unit 424 may be paused.

The use rate of the plating module 110 can be calculated as a rate of an actual use time of the plating module 110 relative to an operation time of the plating apparatus 10, based on the schedule notified from the scheduler 414. For example, in a configuration where the plating module 110 includes two plating devices 114, the operation time of the plating apparatus 10 is 10 hours. It is assumed that in the operation time of 10 hours, a total time spent by the first plating device 114 to perform the plating processing on the substrate (=the actual use time) is 6 hours, and a total plating processing time of the second plating device 114 is 8 hours. Then, the use rate is calculated as $(6+8)/(10 \times 2)=0.7$. In a case where the plating apparatus 10 includes the first to third plating modules 110A, 110B and 110C that perform different types of plating processing, the use rate may be separately calculated for each of the first plating module 110A, the second plating module 110B, and the third plating module 110C.

As described above, the scheduler 414 prepares the schedule based on the target production amount of the substrates and the module use setting, and if the schedule is changed due to change in the target production amount of the substrates or the module use setting, the metrics management unit 418 recalculates the predicted production amount of the substrates and the use rate of the plating module 110 based on the changed schedule. Consequently, the predicted production amount of the substrates and the use rate of the plating module 110 are successively updated depending on the change of the schedule in the plating apparatus 10.

The machine learning unit 424 estimates, by machine learning, how many plating devices 114 of the plurality of plating devices 114 included in the plating module 110 are to be used in most efficiently plating the substrate (i.e., the optimal number of the plating devices 114 for use). More specifically, the machine learning unit 424 acquires the above described target production amount, predicted production amount, use rate and reward from the metrics management unit 418 via the action determination unit 422. The machine learning unit 424 estimates the optimal number of the plating devices 114 for use, based on the target production amount and predicted production amount of the substrates, and the use rate of the plating module 110.

The machine learning unit 424 can estimate the optimal number of the plating devices 114 for use, by use of reinforcement learning that is one method of the machine learning. For example, for "a state $s_t$" in this reinforcement learning, the target production amount of the substrates, the predicted production amount of the substrates and the use rate of the plating module 110 can be adopted, and for "an action $a_t$" in the reinforcement learning, all values that may be taken as the number of the plating devices 114 for use in the plating processing of the substrate can be adopted (provided that t indicates time). The target production amount, predicted production amount and use rate that are included in the state $s_t$ may be adopted for each type of substrate or each type of plating (i.e., each of the first plating module 110A, the second plating module 110B, and the third plating module 110C as described above. As for the action $a_t$, for example, in a configuration where the plating module 110 includes four plating devices 114, five actions of "0", "1", "2", "3" and "4" can be defined, and in a configuration where each of the first to third plating modules 110A, 110B and 110C includes two plating devices 114, nine actions in total, that is, "0", "1" and "2" for the first plating module 110A, "0", "1" and "2" for the second plating module 110B and "0", "1" and "2" for the third plating module 110C can be defined.

Figure 5:
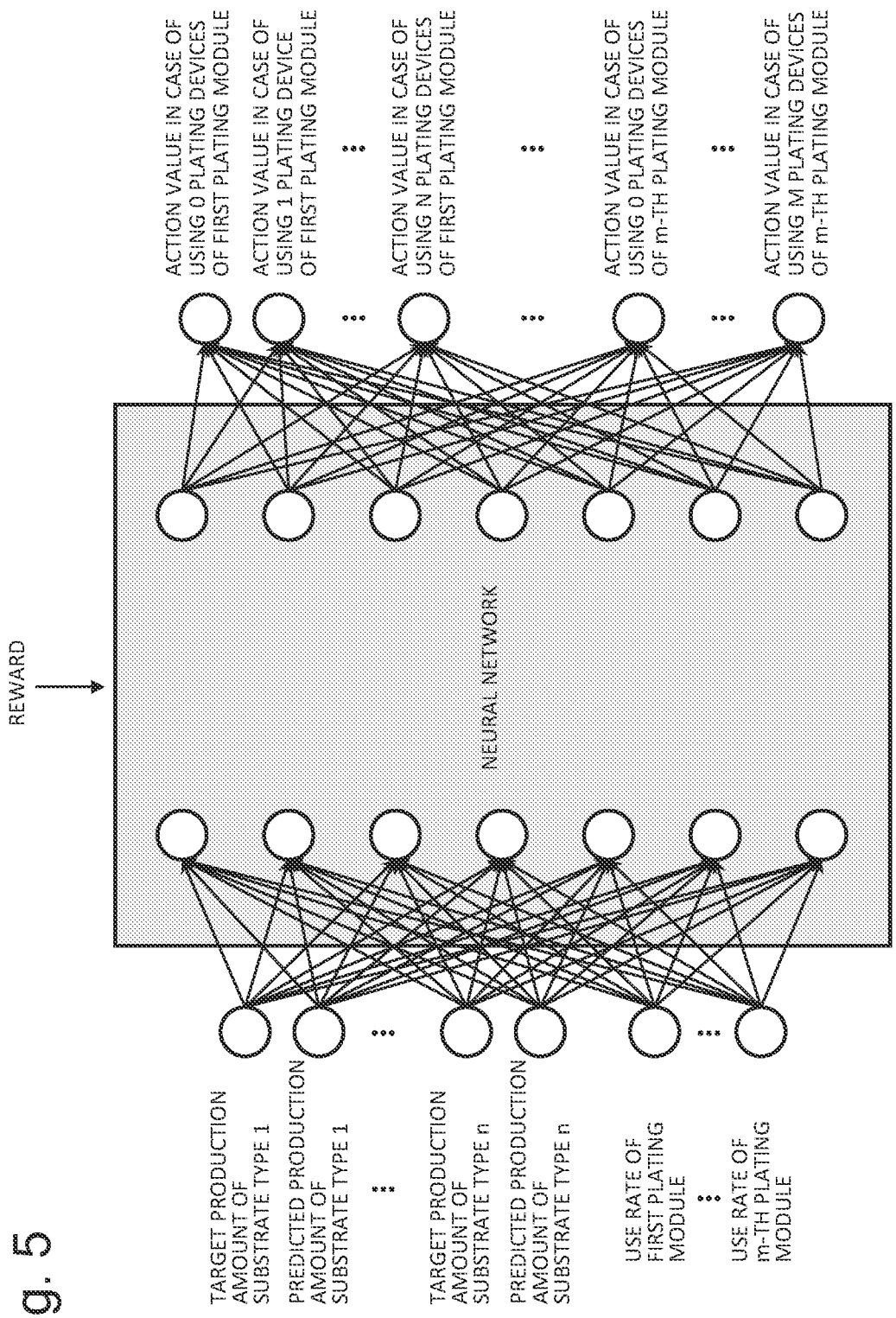
FIG. 5 is a configuration diagram of a machine learning unit in which DQN is used.

The machine learning unit 424 calculates "an action value $Q(s_t, a_t)$" of each action $a_t$ that can be selected in each state $s_t$, by use of "a reward (immediate reward) $r_t$" in the reinforcement learning in which the state $s_t$ and action $a_t$ at time t are prescribed as described above. For example, in the above example, the machine learning unit calculates nine action values, specifically the action value in a case of using "0" plating devices 114 of the first plating module 110A, the action value in a case of using "1" plating device 114 of the first plating module 110A, the action value in a case of using "2" plating devices 114 of the first plating module 110A, the action value in a case of using "0" plating devices 114 of the second plating module 110B, the action value in a case of using "1" plating device 114 of the second plating module 110B, the action value in a case of using "2" plating devices 114 of the second plating module 110B, the action value in a case of using "0" plating devices 114 of the third plating module 110C, the action value in a case of using "1" plating device 114 of the third plating module 110C, and the action value in a case of using "2" plating devices 114 of the third plating module 110C. As an algorithm of calculating the action value $Q(s_t, a_t)$, for example, Q-learning represented by the following formula can be used. Provided that $\alpha$ represents a learning rate, and $\gamma$ represents a time discount rate. Alternatively, the machine learning unit 424 may be configured to use deep Q-network (DQN) in which Q-learning is applied to deep reinforcement learning (see FIG. 5).

$$Q(s_t, a_t) \rightarrow (1-\alpha)Q(s_t, a_t)+\alpha(r_{t+1}+\gamma \max_{a_{t+1}}Q(s_{t+1}, a_{t+1}))$$

[Formula 11]

The machine learning unit 424 calculates the action value $Q(s_t, a_t)$ for the state $s_t$ given from the metrics management unit 418 (i.e., the target production amount, the predicted production amount, and the use rate), and selects a maximum action value from obtained action values $Q(s_t, a_t)$. The action value selected in this manner represents the action having a maximum value obtained when an action $a_t$ (i.e., selection of the number of the plating devices 114 for use) is taken in the state $s_t$, that is, the optimal number of the plating devices 114 fix use. Thus, the machine learning unit 424 can estimate the optimal number of the plating devices 114 for use depending on the state $s_t$ from the metrics management unit 418.

The action determination unit 422 compares the optimal number of the plating devices 114 for use that is estimated by the machine learning unit 424 at latest time with that at last time. In a case where the optimal number for use changes, the action determination unit changes the module use setting (i.e., setting information that designates whether to use or halt each plating device 114 in the plating processing) based on the optimal number of the plating devices 114 for use at the latest time. For example, the module use setting is changed such that if the optimal number for use increases, more plating devices 114 are set to a use state, and if the optimal number for use decreases, more plating devices 114 are set to a non-use (halt) state.

The changed module use setting is sent to the production management unit 412, the scheduler 414 accordingly changes the schedule, and further, the metrics management unit 418 accordingly updates the predicted production amount of the substrates and the use rate of the plating module 110 (i.e., the state $s_t$). Then, this updated state $s_t$ is inputted into the machine learning unit 424 again, and the optimal number of the plating devices 114 for use that is estimated by the machine learning unit 424 accordingly comes close to a more appropriate value. Therefore, this update is repeated, so that accuracy of the estimation of the optimal number for use of the plating devices 114 included in the plating module 110 can successively improve. Also, since the optimal number of the plating devices 114 for use can be accurately obtained, the use/non-use of the plurality of plating devices 114 of the plating apparatus 10 can be more appropriately controlled, and thereby, power consumption of the plating apparatus 10 can be reduced by operating only a minimum number of plating modules 110.

Note that in a configuration where the plating apparatus 10 includes the first to third plating modules 110A, 110B and 110C that perform the same type of plating processing, it is preferable to set the module use setting prepared by the action determination unit 422 such that the plurality of plating devices 114 set to the use state are not distributed to the plurality of plating modules, and are arranged as many as possible in the same plating module. For example, it is preferable that, in a case where each of the first to third plating modules 110A, 110B and 110C includes four plating devices 114 and the optimal number for use is "3", three plating devices 114 of the first plating module 110A are set to the use state, and the remaining plating device 114 of the first plating module 110A and all the plating devices 114 of the second and third plating modules 110B and 110C are set to the non-use state. Consequently, the power consumption of the plating apparatus 10 can be more effectively reduced by completely halting the second and third plating modules 110B and 110C.

To securely reduce the power consumption of the plating apparatus 10, update frequency of the module use setting in the action determination unit 422 may be adjusted. For example, if each plating device 114 is frequently switched between the use state and the halt state, power required to repeatedly raise and lower temperature of the plating solution in the plating device 114 increases, and hence the power consumption of the plating apparatus 10 might not be reduced as a whole, though the optimal number of the plating devices 114 for use are constantly used. To avoid this problem, for example, the action determination unit 422 may calculate, beforehand (before changing the module use setting), the power consumption of the plating apparatus 10 in a case of switching use/non-use of each plating device 114 in accordance with the module use setting, and the action determination unit may actually change the module use setting only in a case of confirming that this switching does not increase the power consumption.

Next, description will be made as to the immediate reward $r_t$ for use by the machine learning unit 424. The immediate reward $r_t$ can be defined, for example, in a formula as follows. Here, $r_{wph}$ is an immediate reward associated with the predicted production amount of the substrates, $r_{usage}$ is an immediate reward associated with the use rate of the plating module 110, and β is an appropriate adjustment coefficient.

$$r_t = \beta r_{wph} * r_{usage} \quad \text{[Formula 2]}$$

The immediate rewards $r_{wph}$ and $r_{usage}$ can also be defined in a formula as follows. Here, $f_x$ is a reward function for a substrate type x, $WPH_{tx}$ is a target production amount of the substrate type x of substrates, $WPH_{mx}$ is a predicted production amount of the substrate type x of substrates, X is a complete set of substrate types (e.g., a substrate type 1, a substrate type 2, and a substrate type 3), $U_m$ is a use rate of the plating module m, and M is a complete set of the plating modules (e.g., the first plating module 110A, the second plating module 110B, and the third plating module 110C).

$$r_{wph} = \prod_{x \in X} f_x(WPH_{tx}, WPH_{mx}) \quad \text{[Formula 3]}$$

$$r_{usage} = \prod_{x \in X} U_m$$

It is preferable that the reward function $f_x$ is a function having a value that increases, as a difference between the target production amount $WPH_{tx}$ and the predicted production amount $WPH_{mx}$ decreases. As an example, the reward function $f_x$ can be defined in a formula as follows.

$$f_x(WPH_{tx}, WPH_{mx}) = e^{-(WPH_{tx} - WPH_{mx})^2} \quad \text{[Formula 4]}$$

When such a reward function $f_x$ as described above is set as the immediate reward $r_{wph}$ of the predicted production amount, the learning of the machine learning unit 424 advances to bring the predicted production amount as close as possible to the target production amount, depending on the target production amount of the substrates that is an input into the system 300, and the predicted production amount of the substrates in which the module use setting in the plating apparatus 10 is reflected. Therefore, the accuracy of the estimation of the optimal number of the plating devices 114 for use can further improve.

Figure 6:
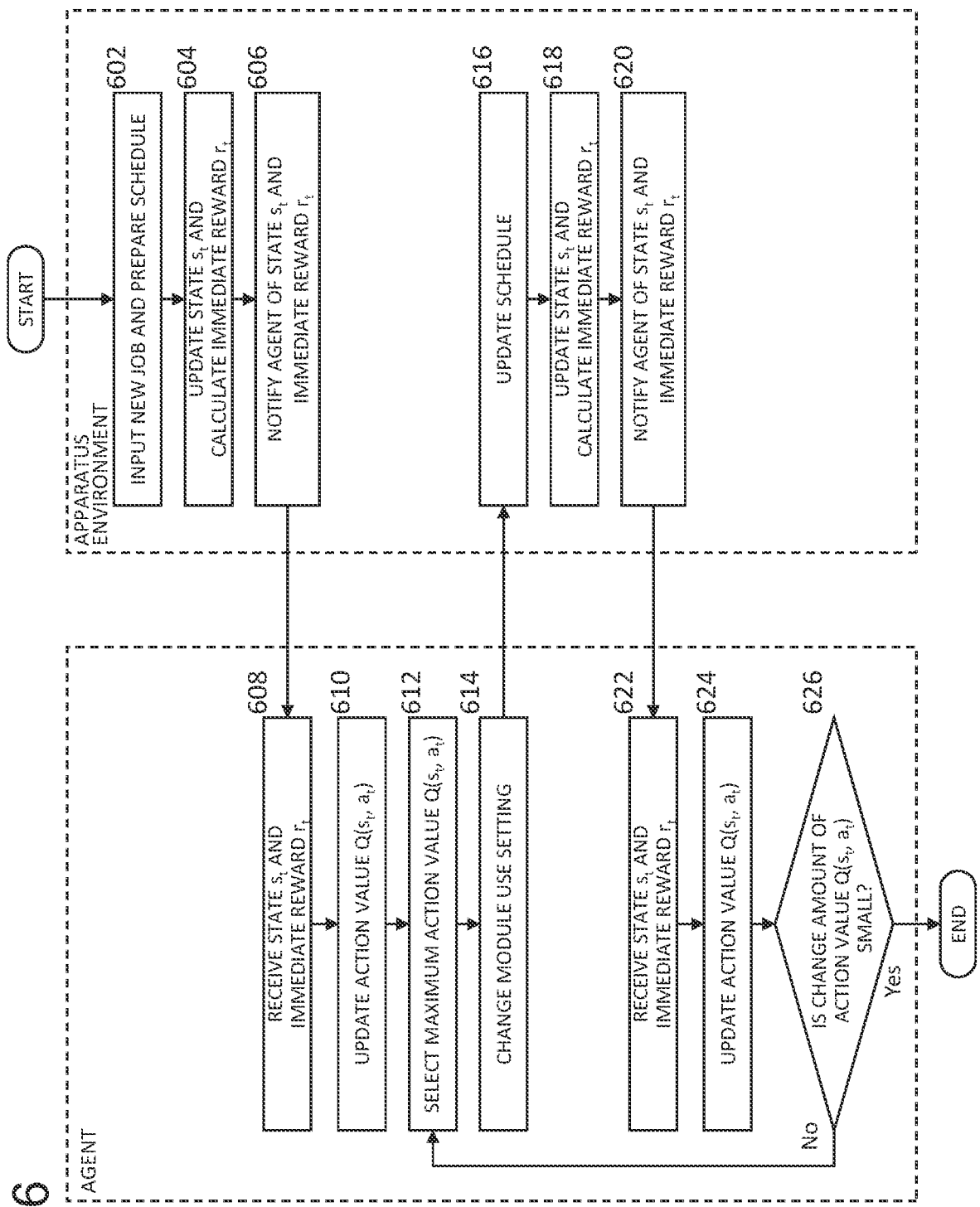
FIG. 6 is a flowchart showing a procedure (learning phase) for performing the method according to the embodiment of the present invention.
Figure 7:
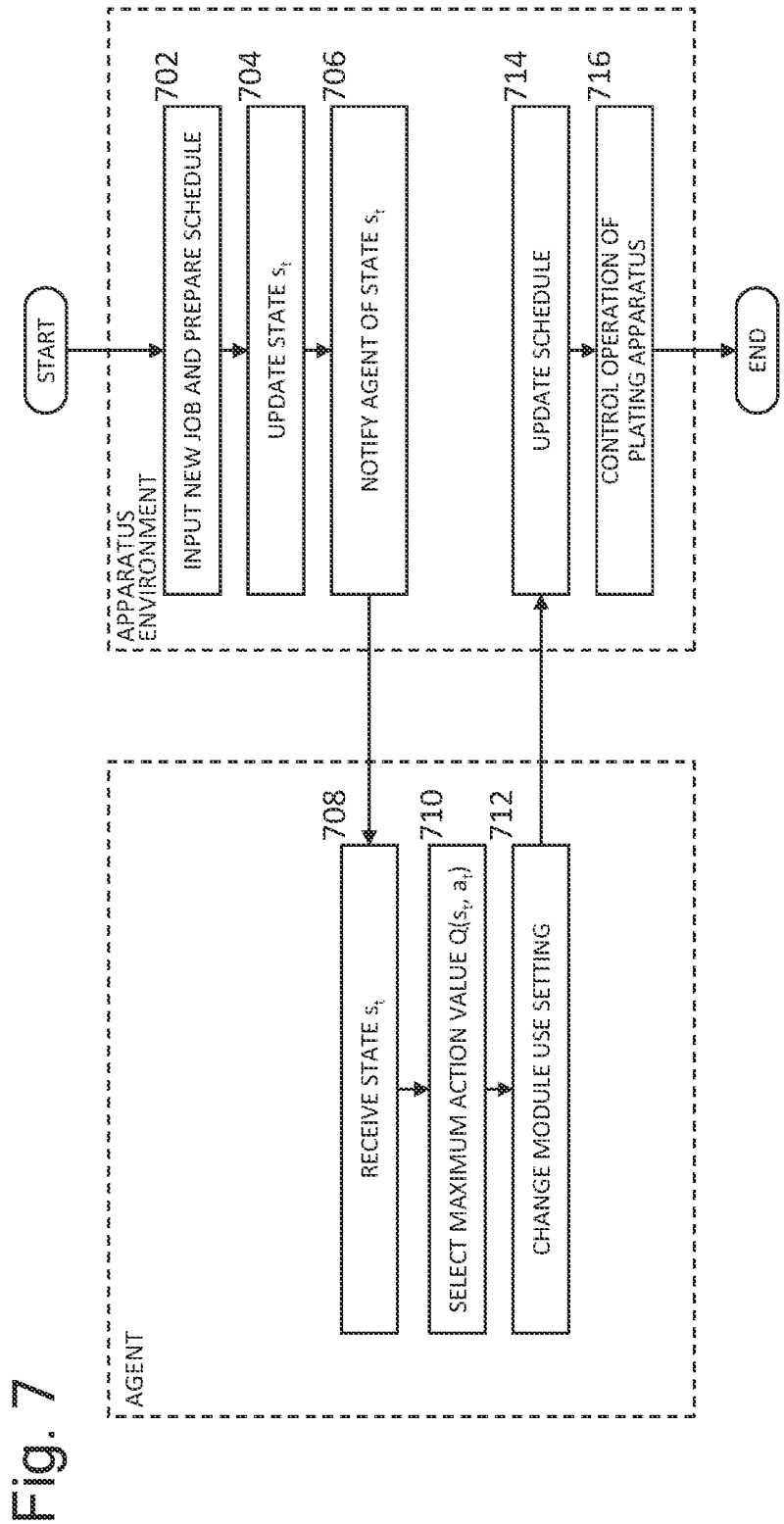
FIG. 7 is a flowchart showing a procedure (operation phase) for performing the method according to the embodiment of the present invention.

FIGS. 6 and 7 are flowcharts showing a procedure for performing a method according to the embodiment of the present invention. First, a procedure for processing in a learning phase of the system 300 will be described with reference to FIG. 6.

Step 602: A new job is inputted into the system 300, and the scheduler 414 prepares the schedule. The new job includes the target production amount.

Step 604: The metrics management unit 418 updates the state $s_t$ (the target production amount, the predicted production amount, and the use rate), and calculates the immediate reward $r_t$.

Step 606: The agent 420 is notified of the state $s_t$ and immediate reward $r_t$.

Step 608: The agent 420 receives the state $s_t$ and the immediate reward $r_t$.

Step 610: The action value $Q(s_t, a_t)$ of the machine learning unit 424 (e.g., a neural network in DQN of FIG. 5) is updated by using the state $s_t$ and the immediate reward $r_t$.

Step 612: The machine learning unit 424 selects the maximum action value $Q(s_t, a_t)$ (i.e., the optimal number of the plating devices 114 for use).

Step 614: The action determination unit 422 changes the module use setting depending on the optimal number for use.

Step 616: The scheduler 414 updates the schedule based on the module use setting.

Step 618: The updated schedule is received, and the state $s_t$ and immediate reward $r_t$ are updated again in the metrics management unit 418.

Step 620: The agent 420 is notified of the updated state $s_t$ and immediate reward Step 622: The agent 420 receives the updated state $s_t$ and immediate reward $r_t$.

Step 624: The action value $Q(s_t, a_t)$ of the machine learning unit 424 is further updated by using the updated state $s_t$ and immediate reward $r_t$.

Step 626: If a change amount of the action value $Q(s_t, a_t)$ is not sufficiently small, the processing returns to the step 612, and the subsequent steps are repeated. If the change amount is sufficiently small, the learning phase ends.

Next, a procedure for processing in an operation phase of the system 300 will be described with reference to FIG. 7.

Step 702: A new job is inputted into the system 300, and the scheduler 414 prepares the schedule. The new job includes the target production amount.

Step 704: The metrics management unit 418 updates the state $s_t$ (the target production amount, the predicted production amount, and the use rate).

Step 706: The agent 420 is notified of the state $s_t$.

Step 708: The agent 420 receives the state $s_t$.

Step 710: The machine learning unit 424 selects the maximum action value $Q(s_t, a_t)$ (i.e., the optimal number of the plating devices 114 for use).

Step 712: The action determination unit 422 changes the module use setting depending on the optimal number for use.

Step 714: The scheduler 414 updates the schedule based on the module use setting.

Step 716: The apparatus controller 416 controls the operations of the respective units of the plating apparatus 10 in accordance with the updated schedule.

The embodiment of the present invention has been described above based on several examples, but the above embodiment of the present invention is described to facilitate understanding of the invention, and does not limit the present invention. The present invention may be changed or modified without departing from the scope, and needless to say, the present invention includes equivalents to the invention. Also, any combination or omission of the respective constituent elements described in claims and specification is possible in a range in which at least some of the above described problems can be solved or a range in which at least some of effects are exhibited.

REFERENCE SIGNS LIST

10 plating apparatus
30 substrate holder
100 cassette
102 cassette table
104 aligner
106 spin rinse dryer 110 plating module
110A first plating module
110B second plating module
110C third plating module
114 plating device
120 load/unload station
122 transfer robot
124 stocker
126 pre-wet module
128 pre-soak module
130a first rinse module
130b second rinse module
132 blow module
136 overflow tank
140 transfer device
142 first transfer device
144 second transfer device
150 rail
152 mounting plate
160 paddle drive part
162 paddle driven part
300 system
320 computer
322 processor
324 memory
326 program
330 network
410 apparatus environment
412 production management unit
414 scheduler
416 apparatus controller
418 metrics management unit
420 agent
422 action determination unit
424 machine learning unit

What is claimed is:

1. A method for determining, in a semiconductor manufacturing apparatus comprising one or a plurality of substrate processing modules each including a plurality of submodules, an optimal number of the submodules for use, the method comprising:
 a step of estimating the optimal number of the submodules for use, based on a target production amount and predicted production amount of substrates and a use rate of the substrate processing module,
 a step of preparing, based on the estimated optimal number for use, a schedule to process a substrate with the optimal number of the submodules for use,
 a step of updating, based on the prepared schedule, the predicted production amount and the use rate, and
 a step of repeating the estimating step by use of the updated predicted production amount and use rate, to update the optimal number of the submodules for use,
 wherein the estimating step includes estimating the optimal number of the submodules for use by use of reinforcement learning in which the target production amount and predicted production amount of the substrates and the use rate of the substrate processing module are represented by a state $s_t$, the number of the submodules to be operated for processing the substrate is represented by an action $a_t$, and an action value of each action $a_t$ in each state $s_t$ is represented by $Q(s_t, a_t)$.

2. The method according to claim 1, wherein the target production amount and predicted production amount of the substrates are a target production amount and predicted production amount for each type of substrate to be produced.

3. The method according to claim 1, wherein an immediate reward $r_t$ of the reinforcement learning is set based on a difference between the target production amount and the predicted production amount.

4. The method according to claim 2, wherein an immediate reward $r_t$ of the reinforcement learning is set based on a difference between the target production amount and the predicted production amount for each type of the substrate.

5. The method according to claim 1, wherein an immediate reward $r_t$ of the reinforcement learning is set based on a product of use rates of the respective substrate processing modules.

6. The method according to claim 1, wherein the plurality of substrate processing modules are a plurality of substrate processing modules performing different types of processing on the substrate, and
 the use rate of the substrate processing module is a use rate of each of the substrate processing modules that are different from one another in processing type.

7. The method according to claim 6, wherein the action value $Q(s_t, a_t)$ is an action value corresponding to the number of submodules to be operated for each of the substrate processing modules that are different from one another in processing type.

8. The method according to claim 1, wherein the reinforcement learning is deep reinforcement learning.

9. The method according to claim 1, further comprising:
 a step of setting use or non-use of each submodule, based on the optimal number for use.

10. The method according to claim 9, wherein the setting step includes setting such that a plurality of submodules for use are included in the same substrate processing module.

11. The method according to claim 1, wherein the substrate processing module is a plating module including a plurality of plating devices, and
 the submodules are the plating devices.

12. A semiconductor manufacturing apparatus comprising one or a plurality of substrate processing modules each including a plurality of submodules, the semiconductor manufacturing apparatus being configured to estimate an optimal number of the submodules for use, based on a target production amount and predicted production amount of substrates, and a use rate of the substrate processing module,
 prepare, based on the estimated optimal number for use, a schedule to process the substrate with the optimal number of the submodules for use,
 update, based on the prepared schedule, the predicted production amount and the use rate, and
 repeat the estimating step by use of the updated predicted production amount and use rate, to update the optimal number of the submodules for use,
 wherein the estimating step includes estimating the optimal number of the submodules for use by use of reinforcement learning in which the target production amount and predicted production amount of the substrates and the use rate of the substrate processing module are represented by a state $s_t$, the number of the submodules to be operated for processing the substrate is represented by an action $a_t$, and an action value of each action $a_t$ in each state $s_t$ is represented by $Q(s_t, a_t)$.

* * * * *